US009679801B2

(12) United States Patent
Lai et al.

(10) Patent No.: US 9,679,801 B2
(45) Date of Patent: Jun. 13, 2017

(54) DUAL MOLDED STACK TSV PACKAGE

(71) Applicant: Apple Inc., Cupertino, CA (US)

(72) Inventors: Kwan-Yu Lai, Campbell, CA (US);
Jun Zhai, Cupertino, CA (US);
Kunzhong Hu, Cupertino, CA (US);
Flynn P. Carson, Redwood City, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/730,171

(22) Filed: Jun. 3, 2015

(65) Prior Publication Data

US 2016/0358889 A1    Dec. 8, 2016

(51) Int. Cl.
*H01L 23/48* (2006.01)
*H01L 23/52* (2006.01)
(Continued)

(52) U.S. Cl.
CPC ........ *H01L 21/768* (2013.01); *H01L 23/3128* (2013.01); *H01L 23/481* (2013.01); *H01L 23/5383* (2013.01); *H01L 23/5384* (2013.01); *H01L 23/5389* (2013.01); *H01L 24/19* (2013.01); *H01L 24/20* (2013.01); *H01L 24/96* (2013.01); *H01L 25/105* (2013.01); *H01L 25/50* (2013.01); *H01L 21/568* (2013.01); *H01L 23/49816* (2013.01); *H01L 24/16* (2013.01); *H01L 24/32* (2013.01); *H01L 24/73* (2013.01); *H01L 24/92* (2013.01); *H01L 2224/0401* (2013.01); *H01L 2224/04105* (2013.01); *H01L 2224/06181* (2013.01); *H01L 2224/12105* (2013.01); *H01L 2224/16227* (2013.01); *H01L 2224/2518* (2013.01); *H01L 2224/32225* (2013.01); *H01L 2224/73204* (2013.01); *H01L 2224/92125* (2013.01); *H01L 2225/1023* (2013.01); *H01L 2225/1035* (2013.01); *H01L 2225/1041* (2013.01); *H01L 2225/1058* (2013.01); *H01L 2924/1421* (2013.01); *H01L 2924/1431* (2013.01); *H01L 2924/1434* (2013.01); *H01L 2924/18161* (2013.01); *H01L 2924/18162* (2013.01); *H01L 2924/19041* (2013.01); *H01L 2924/19042* (2013.01); *H01L 2924/19043* (2013.01); *H01L 2924/19105* (2013.01); *H01L 2924/19106* (2013.01)

(58) Field of Classification Search
CPC ............. H01L 23/147; H01L 23/49816; H01L 23/5383; H01L 23/5385; H01L 25/105; H01L 23/3135; H01L 23/49833; H01L 23/5384; H01L 25/03; H01L 23/3121
See application file for complete search history.

(56) References Cited

U.S. PATENT DOCUMENTS 7,598,617 B2    10/2009    Lee et al.
8,252,629 B2    8/2012    Yee et al.
(Continued)

*Primary Examiner* — Thanh Y Tran
(74) *Attorney, Agent, or Firm* — Blakely Sokoloff Taylor & Zafman LLP

(57) ABSTRACT

Packages including an embedded die with through silicon vias (TSVs) are described. In an embodiment, a first level die including TSVs is embedded between a first redistribution layer (RDL) and a second RDL, and a second level die is mounted on a top side of the first redistribution layer. In an embodiment, the first level die is an active die, less than 50 μm thick.

17 Claims, 10 Drawing Sheets

(51) Int. Cl.
  *H01L 29/40* (2006.01)
  *H01L 21/768* (2006.01)
  *H01L 25/00* (2006.01)
  *H01L 23/31* (2006.01)
  *H01L 23/538* (2006.01)
  *H01L 25/10* (2006.01)
  H01L 21/56 (2006.01)
  H01L 23/498 (2006.01)
  H01L 23/00 (2006.01)

(56) References Cited

U.S. PATENT DOCUMENTS

| | | | |
|---|---|---|---|
| 2009/0236031 A1* | 9/2009 | Sunohara | H01L 21/4857 |
| | | | 156/182 |
| 2011/0049695 A1* | 3/2011 | Shin | H01L 21/561 |
| | | | 257/686 |
| 2014/0091473 A1 | 4/2014 | Len et al. | |
| 2014/0097536 A1* | 4/2014 | Schunk | H01L 31/02325 |
| | | | 257/738 |

\* cited by examiner

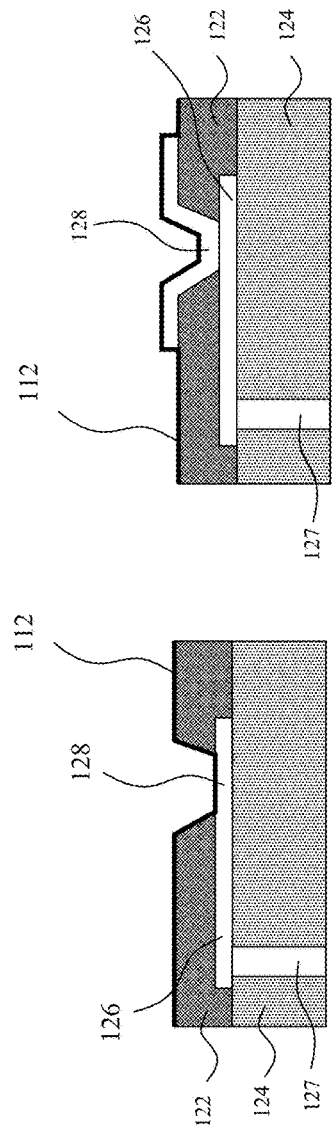
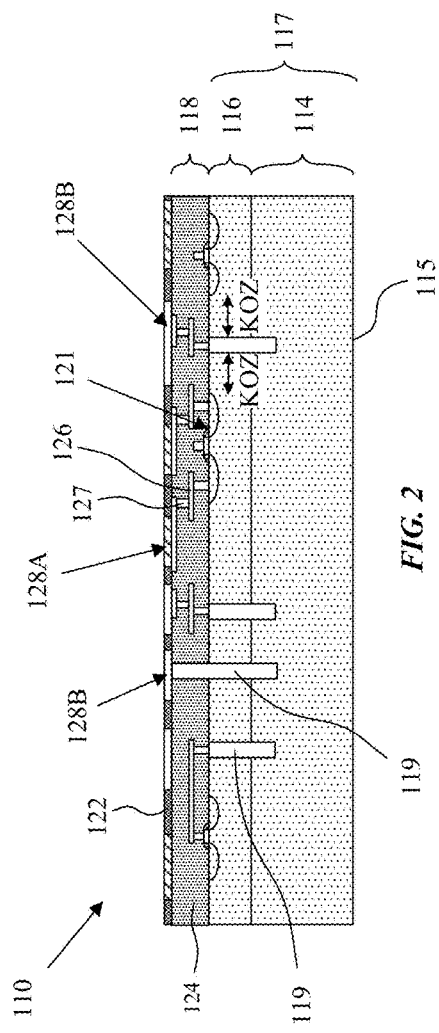

DUAL MOLDED STACK TSV PACKAGE

BACKGROUND

Field

Embodiments described herein relate to semiconductor packaging. More particularly, embodiments relate to packages including an embedded die with through silicon vias.

Background Information

The current market demand for portable and mobile electronic devices such as mobile phones, personal digital assistants (PDAs), digital cameras, portable players, gaming, and other mobile devices requires the integration of more performance and features into increasingly smaller spaces. Additionally, while the form factor (e.g. thickness) and footprint (e.g. area) for semiconductor die packaging is decreasing, the number of input/output (I/O) pads is increasing.

SUMMARY

Embodiments describe semiconductor die packages including a first level die with through silicon vias (TSVs). For example, the first level die may be an active die such as a logic die or system on chip (SOC) die, and the first level die may be embedded in the package between two redistribution layers (RDLs). In accordance with embodiments, the packages may be system in package (SiP) structures. In one embodiment, a package includes a first RDL including a top side and a back side. A second level die is mounted on the top side of the first RDL. The back side of the first RDL is on a front surface of a first level die, and the front surface of the first level die includes a first plurality of first landing pads electrically connected to active devices in the first level die and a second plurality of second landing pads electrically connected a plurality of TSVs in the first level die. The package additionally includes a second RDL including a top side and a back side, with the top side of the second RDL on a back surface of the first level die. In accordance with embodiments, the first level die may include active devices and be less than 50 μm thick.

The first level die may additionally include one or more interconnect layers between the active devices and the front surface of the first level die. A first level molding compound can encapsulate the first level die between the first RDL and the second RDL, and a second level molding compound can encapsulate the second level die on the first RDL. In an embodiment, the second level molding compound also encapsulates a non-silicon compound mounted on the first RDL. A plurality of conductive pillars may be formed on the first RDL and extend through the second level molding compound. For example, this may provide an electrical connection to bond a second package to for a package on package (PoP) structure. A plurality of conductive bumps can be placed on the back side of the second RDL, for example, for bonding the package or PoP. In an embodiment, each TSV has a maximum width of 10 μm or less. In an embodiment, the first RDL is directly on the front surface of the first level die, the second RDL is directly on the back surface of the first level die, and the first RDL and the second RDL each have a maximum thickness of less than 30 μm.

In one embodiment, a package includes a first RDL including a top side and a back side. A second level die is mounted on the top side of the first RDL. The back side of the first RDL is on a front surface of a first level die, the first level die comprises active devices and a plurality of TSVs, and the first level die is less than 50 μm thick. The package additionally includes a second RDL including a top side and a back side, with the top side of the second RDL directly on a back surface of the first level die.

In accordance with embodiments, a thinned first level active die with TSVs embedded between RDLs may be used to achieve smaller package dimensions with a high I/O count. In an embodiment, each TSV has a maximum width of 10 μm or less. Each TSV may also have an aspect ratio of less than 10:1 of first level die thickness : TSV maximum width. At these sizes a TSV keep out zone may be reduced to less than 5 μm. At these dimensions the first level die may have a TSV density of at least 2,500 per $mm^2$. Additionally, the first RDL and the second RDL may each have a maximum thickness of less than 30 μm.

In an embodiment, a method of forming a package includes encapsulating a first level die on a carrier substrate with a first level molding compound, removing the carrier substrate, forming a first RDL on the first level die and the first level molding compound, mounting a second level die on the first RDL, encapsulating the second level die on the first RDL with a second level molding compound, reducing a thickness of the first level die and the first level molding compound, and forming a second RDL on the first level molding compound and on TSVs of the first level die. In an embodiment, the TSVs are exposed when reducing the thickness of the first level die and the first level molding compound. In an embodiment, the TSV are formed through the first level die after reducing the thickness of the first level die and the first level molding compound, and prior to forming the second RDL. In an embodiment, the first RDL may be formed directly on a first plurality of first landing pads electrically connected to active devices in the first level die, and formed directly on a second plurality of second landing pads electrically connected to the TSVs.

BRIEF DESCRIPTION OF THE DRAWINGS

FIG. 2 is a schematic cross-sectional side view illustration of a first level die including blind vias in accordance with an embodiment.

FIG. 3 is a close up cross-sectional side view of a first level die with polymer defined landing pads in accordance with an embodiment.

FIG. 4 is a close up cross-sectional side view of a first level die with UBM defined landing pads in accordance with an embodiment.

DETAILED DESCRIPTION

Figure 1:
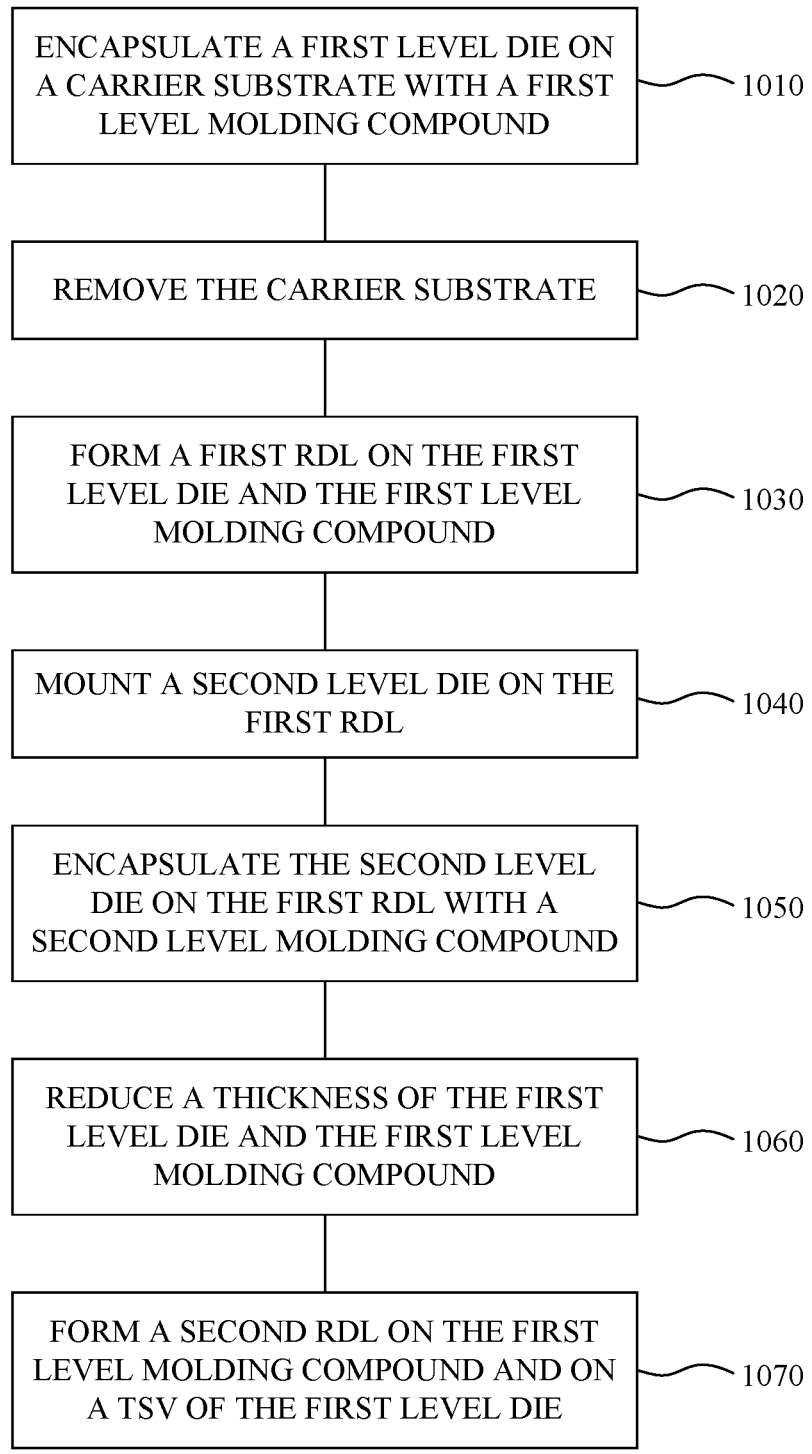
FIG. 1 is a flow chart illustrating a method of forming a package in accordance with an embodiment.

Embodiments describe semiconductor packages including a first level die with through silicon vias (TSVs). Specifically, the first level die may be a thinned active die with TSVs embedded in the package. In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "top", "bottom", "front", "back", "over", "to", "between", and "on" as used herein may refer to a relative position of one layer with respect to other layers. One layer "over", or "on" another layer or bonded "to" or in "contact" with another layer may be directly in contact with the other layer or may have one or more intervening layers. One layer "between" layers may be directly in contact with the layers or may have one or more intervening layers.

In one aspect, embodiments describe a package design involving a dual molded wafer process flow with an embedded first level die (e.g. active die) including TSVs. The process flow is such that the embedded first level die with TSVs can be thinned down to extremely thin levels (e.g. less than 50 µm, or more specifically less than 20 µm, or 5 µm), which is much thinner than a traditional interposer, for example, with a thickness of at least 150 µm. At the reduced thickness, short and direct routing paths (e.g. with a vertical height less than 100 µm) can be designed from the package bottom surface contacts (e.g. landing pads or conductive bumps) to a second level die in the package. As a result, signal and power routing penalties commonly associated with a traditional stacked die (e.g. with a vertical routing height greater than 100 µm from a package bottom surface contacts to a second level die) is not prohibitive. Embodiments may be used for a variety of die integration schemes, including system on chip (SOC) die splitting (e.g. splitting an SOC into stacked die), die partitioning (e.g. functionally partitioning an SOC die), MEM/AP (memory-application processor) die stacking, VR (voltage regulation) integration, passives integration, and other heterogeneous combinations of technologies in a relatively thin form factor.

In one aspect, embodiments describe an embedded TSV first level die configuration that may have a comparatively low keep out zone (KOZ). It has been observed that TSVs, such as copper TSVs through a silicon die, can create stress in the surrounding die area. As a result, active devices are arranged outside of a lateral KOZ around a TSV to mitigate TSV-induced stress on the active devices, such as affecting carrier mobility in the active devices. In accordance with embodiments, the reduced thickness of the embedded active first level die can allow the formation of TSVs with a substantially less width (or diameter) compared to common TSVs such as those in a traditional interposer. In some embodiments, aspect ratios of at most 10:1 first level die thickness:TSV maximum width are well within processing parameters. For example, TSVs having a maximum width (or diameter) of 10 µm, or much less are possible. An exemplary list of TSV dimensions and aspect ratios is provided in Table 1 for illustrative purposes.

TABLE 1

TSV dimensions and aspect ratios

| First level die thickness (µm) | TSV width (µm) | TSV aspect ratio |
|---|---|---|
| 100 | 10 | 10:1 |
| 50 | 5 | 10:1 |
| 50 | 10 | 5:1 |
| 5 | 5 | 10:1 |

A reduced TSV height may allow for reduced TSV maximum width (or diameter), as well as increased TSV density and a smaller KOZ. In some embodiments, a TSV density of 50×50 per mm² (e.g. 2,500 per mm²) is possible, which may be greater than that achievable with traditional interposers at approximately 10×10 per mm² (or 1,000 per mm²). In some embodiments, a KOZ of less than approximately 5 µm is possible. In an embodiment, a TSV through the active first level die is within 5 µm of an active device (e.g. transistor) in the active first level die. In one aspect, this may allow for a greater degree of freedom in location of the active devices, as well as location and density of the TSVs to provide a shorter and more direct routing from a bottom landing pad or conductive bump (e.g. solder bump or stud bump) of the package to the stacked second level die or a top package in a package on package (PoP) structure. In accordance with embodiments the stacked second level die or top package can have relatively straight routing to the bottom landing pad or conductive bump of the (bottom) package, where the power plane is, for example on a circuit board.

In one embodiment, a package includes a first RDL including a top side and a back side. A second level die is mounted on the top side of the first RDL. The back side of the first RDL is on a front surface of a first level die, and the front surface of the first level die includes a first plurality of first landing pads electrically connected to active devices in the first level die and a second plurality of second landing pads electrically connected a plurality of TSVs in the first level die. The package additionally includes a second RDL including a top side and a back side, with the top side of the second RDL on a back surface of the first level die. In accordance with embodiments, the first level die may include active devices and be less than 50 µm thick.

In one embodiment, a package includes a first RDL including a top side and a back side. A second level die is mounted on the top side of the first RDL. The back side of the first RDL is on a front surface of a first level die, the first level die comprises active devices and a plurality of TSVs, and the first level die is less than 50 µm thick. The package additionally includes a second RDL including a top side and a back side, with the top side of the second RDL directly on a back surface of the first level die.

FIG. 1 is a flow chart illustrating a method of forming a package in accordance with an embodiment. In interest of clarity, the following description of FIG. 1 is made with regard to reference features found in FIGS. 2-13. At operation a 1010 a first level die 110 is encapsulated on a carrier substrate 102 with a first level molding compound 130, followed by removal of the carrier substrate 102 at operation 1020. One or more through mold vias (TMVs) 164 and/or non-silicon component(s) 400 may optionally be encapsulated on the carrier substrate with the first level molding compound at operation 1010. A first RDL 140 is then formed on the first level die 110 and the first level molding compound 130, and optionally the TMVs 164 and non-silicon component(s) 400 at operation 1030. Conductive pillars 190 may then be optionally formed on the first RDL 140. A second level die 150, and optionally one or more non-silicon components 300, are then mounted on the first RDL 140 at operation 1040. At operation 1040 the second level die 150 is encapsulated on the first RDL 140 with a second level molding compound 160. A thickness of the first level die 110 and the first level molding compound 130 is then reduced at operation 1060, for example, using chemical mechanical polishing (CMP). A second RDL 170 may then be formed on the first level molding compound 130 and on a TSV 120 of the first level die 110 at operation 1070. In some embodiments, the first level die 110 is an active die including pre-formed blind vias 119 at operation 1010, and the reduction in thickness at operation 1060 exposes the blind vias 119 to form TSVs 120. In another embodiment, the TSVs 120 may be formed in the first level die 110 after reducing the thickness of the first level die 110 at operation 1060. Various additional structural features and variations of the process and structure are described with regard to FIGS. 2-13.

Referring now to FIG. 2 a schematic cross-sectional side view is provided of a first level die 110 including blind vias 119 in accordance with an embodiment. In accordance with embodiments, the first level die 110 may be an active die such as a logic die or SOC die including an active component(s) such as, but not limited to, a microprocessor, memory, RF transceiver, and mixed-signal component. In the particular embodiment illustrated, an active device 121 (e.g. transistor) of an active component is shown by way of example. As shown, the active devices 121 may be formed on a substrate 117 such as a silicon substrate or silicon on insulator (SOI) substrate. In an embodiment, the active devices 121 are formed in a top epitaxial silicon layer 116, formed over a base silicon substrate 114. In an embodiment, the KOZ is less than 5 µm, and a blind via 119 is formed within 5 µm (laterally) of an active device 121. One or more interconnect layers 118 may be formed for routing purposes to connect the active devices 121 and blind vias 119 to landing pads 128 (including both 128A, 128B on the front surface 112) of the first level die 110. The interconnect layers 118 may include one or more metal layers 126 and/or dielectric layers 124. In the embodiment illustrated, the blind vias 119 (which will become TSVs 120) are interspersed between the active devices 121 in the first level die 110.

The landing pads 128 may be exposed in a variety of ways. FIG. 3 is a close up cross-sectional side view of a first level die 110 with polymer defined landing pads 128 in accordance with an embodiment. As shown, a passivation layer 122 (e.g. polyimide) is formed over a top metal layer 126. The landing pad 128 is defined by an opening in the passivation layer 122 exposing the underlying top metal layer 126. FIG. 4 is a close up cross-sectional side view of a first level die 110 with under bump metallurgy (UBM) defined landing pads 128 in accordance with an embodiment. As shown, a passivation layer 122 (e.g. polyimide) is formed over a top metal layer 126. An opening is formed in the top metal layer 126, and a UBM pad is formed over the opening and in contact with the top metal layer 126. In this configuration, the UBM pad corresponds to the landing pad 128.

Referring to FIGS. 2-4, the metal layer(s) 126 may provide lateral interconnect paths, with vias 127 providing vertical connections. In accordance with embodiments, the front surface 112 of the first level die 110 includes landing pads 128B connected to blind vias 119, and landing pads 128A connected to the active devices 121 of the first level die 110. In the embodiment illustrated, the blind vias 119 are formed in the active layer (e.g. interconnect layer 118) of the active devices 121. The blind vias 119 may extend completely through the active layer (e.g. interconnect layer 118) and optionally into the base substrate 114. The depth of the blind vias 119 may be at least the depth of the final TSVs 120 to be formed. In an embodiment, the blind vias 119 may be formed in an SOI substrate, with the top silicon SOI layer corresponding to epitaxial layer 116 in FIG. 2. In an embodiment, the blind vias 119 may optionally extend at least partially through the interconnect layer(s) 118. For example, blind vias 119 may extend through the interconnect layer 118 to landing pads 128A, or to a metal layer 126 in an embodiment. In an embodiment, blind vias 119 may not contact a landing pad (e.g. 128A, 128B) on the front surface 112 and instead connect with an active device 121 through one or more metal layers 126 and vias 127 in the interconnect layer 118. In this manner, the TSVs 120 to be formed can connect directly to the active devices 121 within the first level die 110 without routing through the first RDL 140, yet to be formed.

Figure 5:
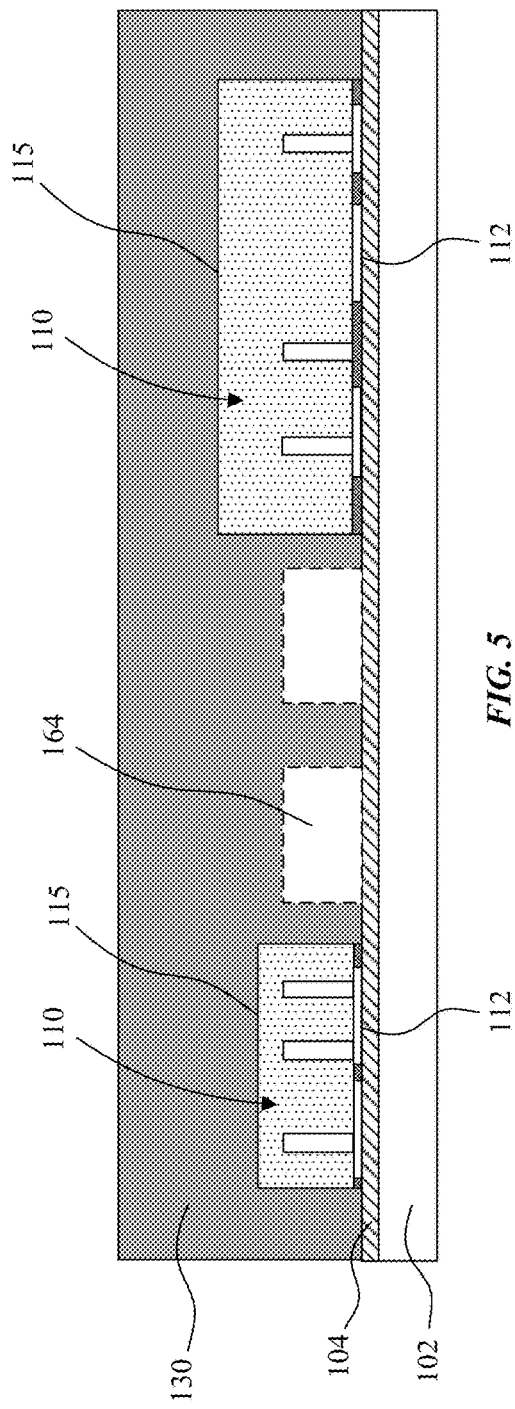
FIG. 5 is a cross-sectional side view illustration of a first level die including blind vias mounted on a carrier substrate and encapsulated with a first level molding compound in accordance with an embodiment.

Referring now to FIG. 5, one or more first level die 110 are mounted on a carrier substrate 102 such as a glass panel, silicon wafer, metal panel, etc. The carrier substrate 102 may include an adhesive (e.g. polymer) or tape layer 104 for mounting the first level die 110. As shown, the first level die 110 are mounted onto the carrier substrate 102 face down, such that the front surface 112 including the landing pads 128 (128A, 128B) is face down. In an embodiment, one or more non-silicon components 400 (see FIG. 13) are optionally mounted onto the carrier substrate 102 with the one or more first level die 110. In an embodiment, through mold vias (TMVs) 164 are optionally formed on the carrier substrate. The material of optional TMVs 164 can include, but is not limited to, a metallic material such as copper, titanium, nickel gold, and combinations or alloys thereof. TMVs 164 may be formed using a suitable processing technique, and may be formed of a variety of suitable materials (e.g. copper) and layers. In an embodiment, TMVs 164 are formed by a plating technique, such as electroplating using a patterned photoresist to define the TMV dimensions, followed by removal of the patterned photoresist layer. In an embodiment, the optional TMVs 164 are formed prior to mounting of the first level die 110.

The plurality of first level die 110 and optional TMVs 164 and/or non-silicon component(s) 400 are then encapsulated in a first level molding compound 130 on the carrier substrate 102. For example, the first level molding compound 130 may include a thermosetting cross-linked resin (e.g. epoxy), though other materials may be used as known in electronic packaging. Encapsulation may be accomplished using a suitable technique such as, but not limited to, transfer molding, compression molding, and lamination. In the embodiment illustrated, the first level molding compound 130 covers the back surfaces 115 of the first level die 110, and optional TMVs 164 and/or non-silicon component(s) 400 in order to provide structural support, e.g. as a reconstituted wafer, during subsequent processing.

Figure 6:
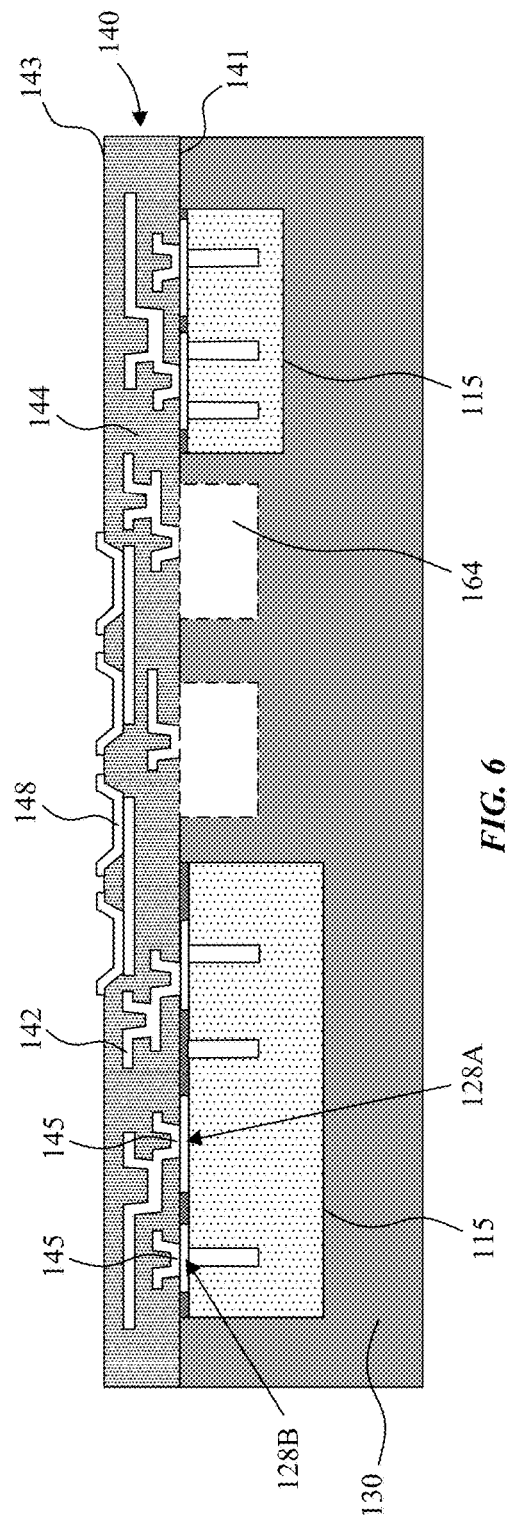
FIG. 6 is a cross-sectional side view illustration of a first RDL formed on a first level molding compound and a first level die including blind vias in accordance with an embodiment.

Referring now to FIG. 6 a first redistribution layer (RDL) 140 is formed on the first level molding compound 130 and the exposed surfaces of the landing pads 128A, 128, and optionally exposed surfaces of the TMVs 164 and/or non-silicon component(s) 400, when present. As shown, the first RDL 140 includes a top side 143 and a back side 141 formed directly on the front surface 112 of the first level die 110. The first RDL 140 may include a single redistribution line 142 or multiple redistribution lines 142 and dielectric layers 144. The first RDL 140 may be formed by a layer-by-layer process, and may be formed using thin film technology. In an embodiment, the first RDL 140 has a total thickness of less than 50 µm, or more specifically less than 30 µm, such as approximately 20 µm. In an embodiment, first RDL 140 includes embedded redistribution lines 142 (embedded traces). For example, the redistribution lines 142 may be created by first forming a seed layer, followed by forming a metal (e.g. copper) pattern. Alternatively, redistribution lines 142 may be formed by deposition (e.g. sputtering) and etching. The material of redistribution lines 142 can include, but is not limited to, a metallic material such as copper, titanium, nickel, gold, and combinations or alloys thereof. The metal pattern of the redistribution lines 142 is then embedded in a dielectric layer 144, which is optionally patterned. The dielectric layer(s) 144 may be any suitable material such as an oxide, or polymer (e.g. polyimide).

In the embodiment illustrated, redistribution lines 142 are formed directly on the landing pads 128A, 128B. More specifically, contact pads 145 of the redistribution lines 142 of the first RDL 140 are formed directly on the landing pads 128A, 128B of first level die 110, and optionally directly on the TMVs 164 and/or directly one the non-silicon component(s) 400.

Figure 7:
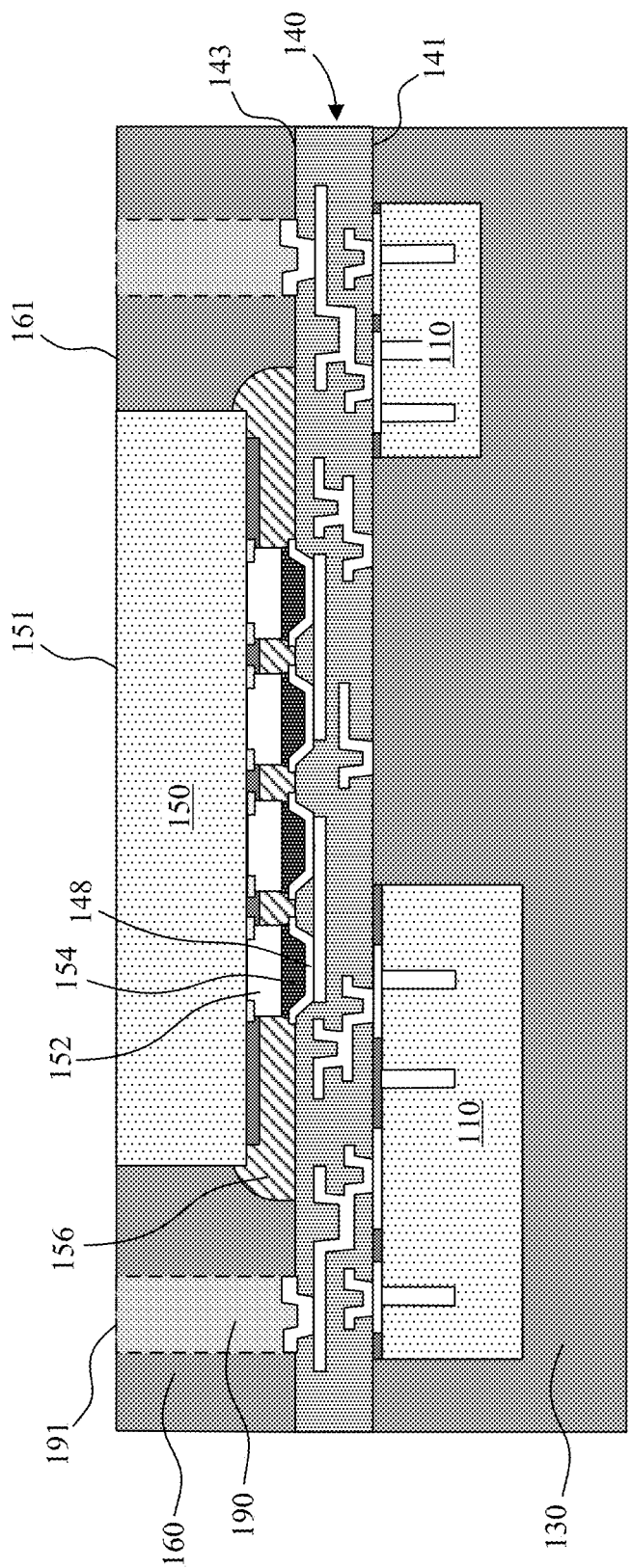
FIG. 7 is a cross-sectional side view illustration of a second level die mounted on the first RDL and encapsulated with a second level molding compound in accordance with an embodiment.

Following the formation of the first RDL 140 a plurality of conductive pillars 190 may optionally be formed on the first RDL 140 as illustrated in FIG. 7. Conductive pillars 190 may be formed similarly, and of the same materials as described above with regard to the optional TMVs 164.

Referring to FIG. 7 one or more second level die 150, and optionally non-silicon component(s) 300 (see FIGS. 12-13, e.g. transducer, passive device such as inductor, capacitor, filter), are mounted (e.g. surface mounted with solder joints) on the top side 143 of the first RDL 140. In the embodiment illustrated, second level die 150 is front facing toward the first RDL 140 and is attached to landing pads or under bump metallurgy (UBM) pads 148 of the first RDL 140 with conductive bumps, such as stud bumps, solder bumps, or stud bumps 152 with solder tips 154. Following mounting of the second level die 150 to the first RDL 140, an underfill material 156 may optionally be applied to between the second level die 150 and first RDL 140. In an embodiment, the back side of the second level die 150 does not include any conductive contacts (e.g. stud bumps, solder bumps, etc.).

In an embodiment, the second level die 150 may be an SOC die, for example in a die splitting configuration in which first level die 110 and second level die 150 slit SOC components. In an embodiment, second level die 150 is a memory die, such as dynamic random-access memory (DRAM). In an embodiment, second level die 150 is a voltage regulator die. In such a configuration, the second level (voltage regulator) die 150 controls voltage to the first level (SOC) die 110. In accordance with embodiments, the relatively small thickness of the RDLs (140 and 170 to be formed) and first level die 110 allows for signal/power routing to the second level die 150 which is much shorter than for a typical stack package. Accordingly, this allows for the location of a second level (voltage regulator) die 150 on top of a first level (SOC) die 110 in one embodiment.

The second level die 150, and optional conductive pillars 190 and/or optional non-silicon components 300 are then encapsulated in a second level molding compound 160 on the first RDL 140. The second level molding compound 160 may be formed similarly as, and from the same material as the first level molding compound 130. Following encapsulation with the second level molding compound, the structure may optionally be processed with a grinding operation, etching operation, or patterned and etched to expose the top surface 151 of the second level die, and optional conductive pillars 190. In an embodiment, the top surface 161 of the second level molding compound 160, and the top surface 151 of the second level die 150, and optional top surface 191 of the conductive pillars 190 are coplanar after a grinding or etching operation.

Figure 8A:
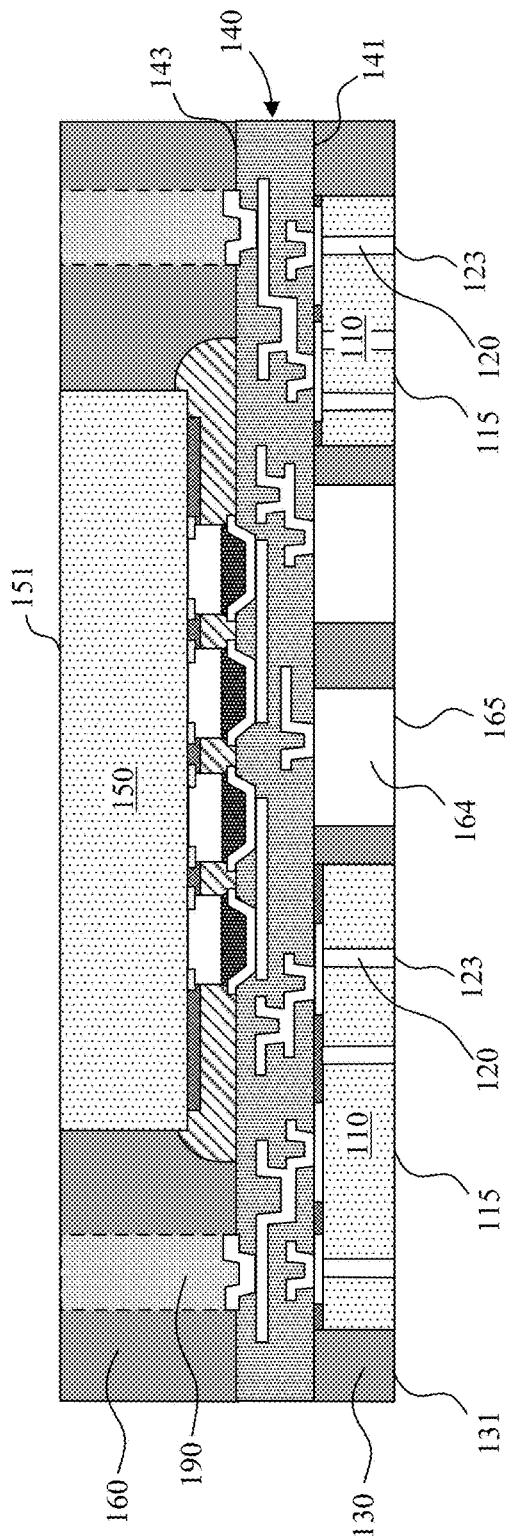
FIG. 8A is a cross-sectional side view illustration of a thinned first level molding compound and thinned first level die with exposed TSVs in accordance with an embodiment.

Following the formation of the second level molding compound 160, and optional reduction in thickness, the second level molding compound 160 may be used as the carrier, e.g. reconstituted wafer, for reducing a thickness of the first level molding compound 130, first level die 110, and optional TMVs 164 and optional non-silicon component(s) 300. FIG. 8A is a cross-sectional side view illustration of a thinned first level molding compound 130 and thinned first level die 110 with exposed TSVs 120 in accordance with an embodiment. In accordance with some embodiments, thinning is achieved with a grinding operation (e.g. CMP) to expose the blind vias 119, resulting in a back surface 115 of the first level die 110 including exposed surfaces 123 of TSVs 120. In an embodiment, the first level die 110 is thinned to less than 50 µm thick, or more specifically less than 20 µm.

Figure 8B:
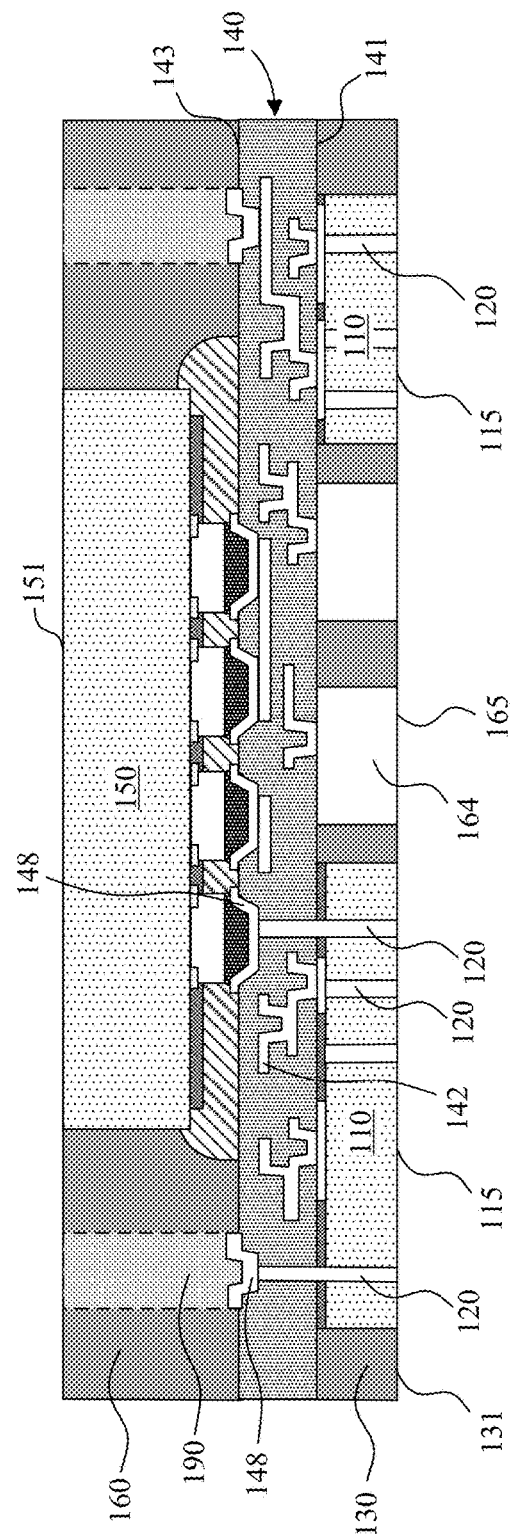
FIG. 8B is a cross-sectional side view illustration of a thinned first level molding compound and thinned first level die with TSVs extending through the first level die and first RDL in accordance with an embodiment.

In an embodiment, rather than forming TSVs 120 by thinning the first level die 110 to expose the blind vias 119, the structure illustrated in FIG. 8A may be achieved by forming TSVs 120 after thinning using suitable processing techniques such as etching and plating to form the TSVs 120. Referring now to FIG. 8B in an embodiment, TSVs 120 formed after thinning can extend through the first level die 110 and into the first RDL 140 in accordance with an embodiment. For example, the TSVs 120 may extend to a redistribution line (e.g. metal layer) 142 within the first RDL 140, or to the landing pads or under bump metallurgy (UBM) pads 148 of the first RDL 140 for direct connection to the second level die 148 or optional conductive pillars 190. In an embodiment, TSVs 120 extending through the first RDL 140 may have a maximum width greater than 10 µm.

Figure 9:
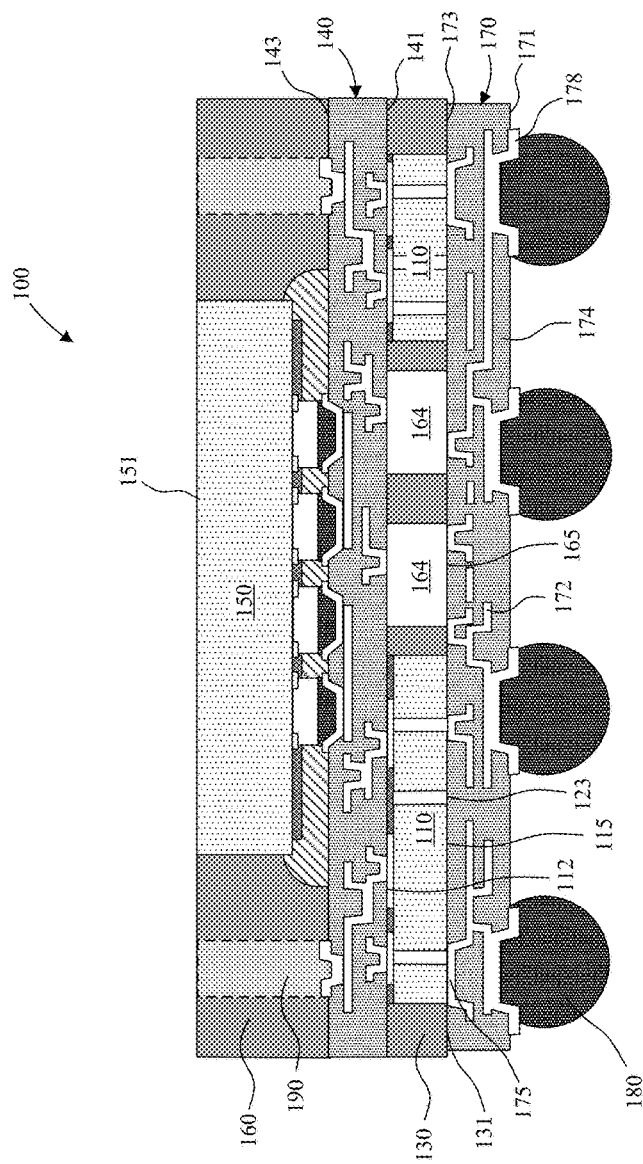
FIG. 9 is a cross-sectional side view illustration of a package including a thinned first level die and through mold vias in accordance with an embodiment.

Referring now to FIG. 9, a second RDL 170 is then formed on (e.g. directly on) the exposed top side 131 of the second level molding compound 130, the exposed surfaces 123 of TSVs 120 on the back surface 115 of the first level die 110, and optionally the exposed surfaces 165 of the TMVs 164 and optionally the exposed surfaces of the non-silicon component(s) 300. As shown, the second RDL 170 includes back side 171 and a top side 173 formed directly on the back surface 115 of the first level die 110. The second RDL 170 may include a single redistribution line 172 or multiple redistribution lines 172 and dielectric layers 174. The second RDL 170 may be formed by a layer-by-layer process, and may be formed using thin film technology. In an embodiment, the second RDL 170 has a total thickness of less than 50 µm, or more specifically less than 30 µm, such as approximately 20 µm. In an embodiment, second RDL 170 includes embedded redistribution lines 172 (embedded traces). For example, the redistribution lines 172 may be created by first forming a seed layer, followed by forming a metal (e.g. copper) pattern. Alternatively, redistribution lines 172 may be formed by deposition (e.g. sputtering) and etching. The material of redistribution lines 172 can include, but is not limited to, a metallic material such as copper, titanium, nickel, gold, and combinations or alloys thereof. The metal pattern of the redistribution lines 172 is then embedded in a dielectric layer 174, which is optionally patterned. The dielectric layer(s) 174 may be any suitable material such as an oxide, or polymer (e.g. polyimide).

In the embodiment illustrated, redistribution lines 172 are formed directly on the exposed surfaces 123 of the TSVs 120, and optionally the exposed surfaces 165 of the TMVs 164 and/or non-silicon component(s) 300. In the embodiment illustrated, contact pads 175 of the redistribution lines 172 of the second RDL 170 are formed directly on the exposed surfaces 123 of the TSVs 120, and optionally the exposed surfaces 165 of the TMVs 164. Following the formation of the second RDL 170 a plurality of conductive bumps 180 (e.g. solder bumps, or stud bumps) may be formed on landing pads (e.g. UBM pads) 178 on the back side 171 of the second RDL 170.

Figure 10:
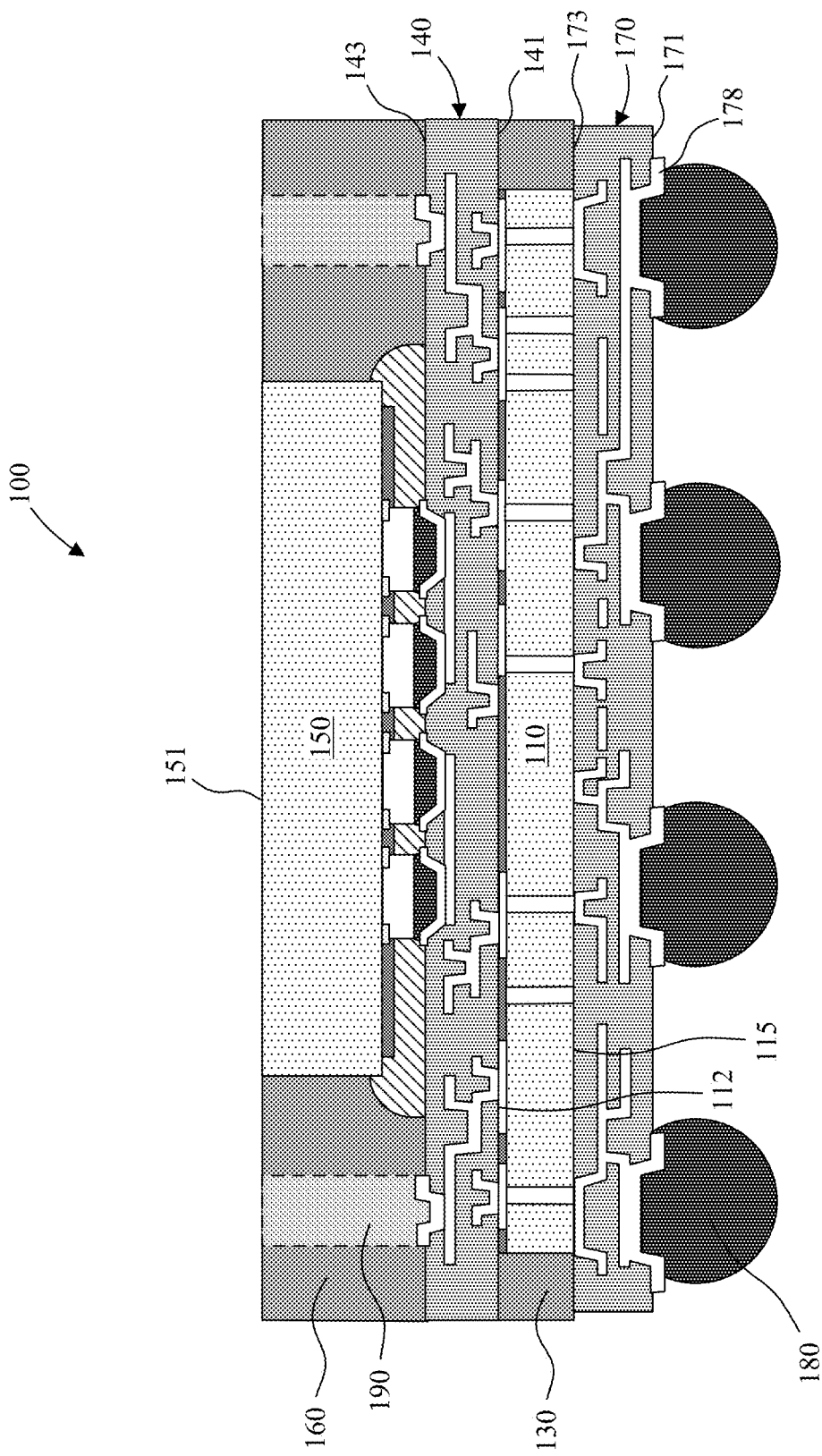
FIG. 10 is a cross-sectional side view illustration of a package including a thinned first level die in accordance with an embodiment.

FIG. 10 is a cross-sectional side view illustration of a package 100 variation including a thinned first level die 110 in accordance with an embodiment. Similar to the package 100 illustrated in FIG. 9, the thinned first level die 110 is embedded within the package between the first RDL 140 and second RDL 170. While FIG. 9 illustrates multiple first level die 110, and optional TMVs 164, the embodiment illustrated in FIG. 10 includes a single, larger first level die 110. This may allow for the inclusion of more components within a single first level die 110 (e.g. logic or SOC die), while retaining short and direct routing from landing pads 178 of the second RDL 170, through the second RDL 170, through TSVs 120 of the first level die 110, through the first RDL 140, and to the second level die 150.

Figure 11:
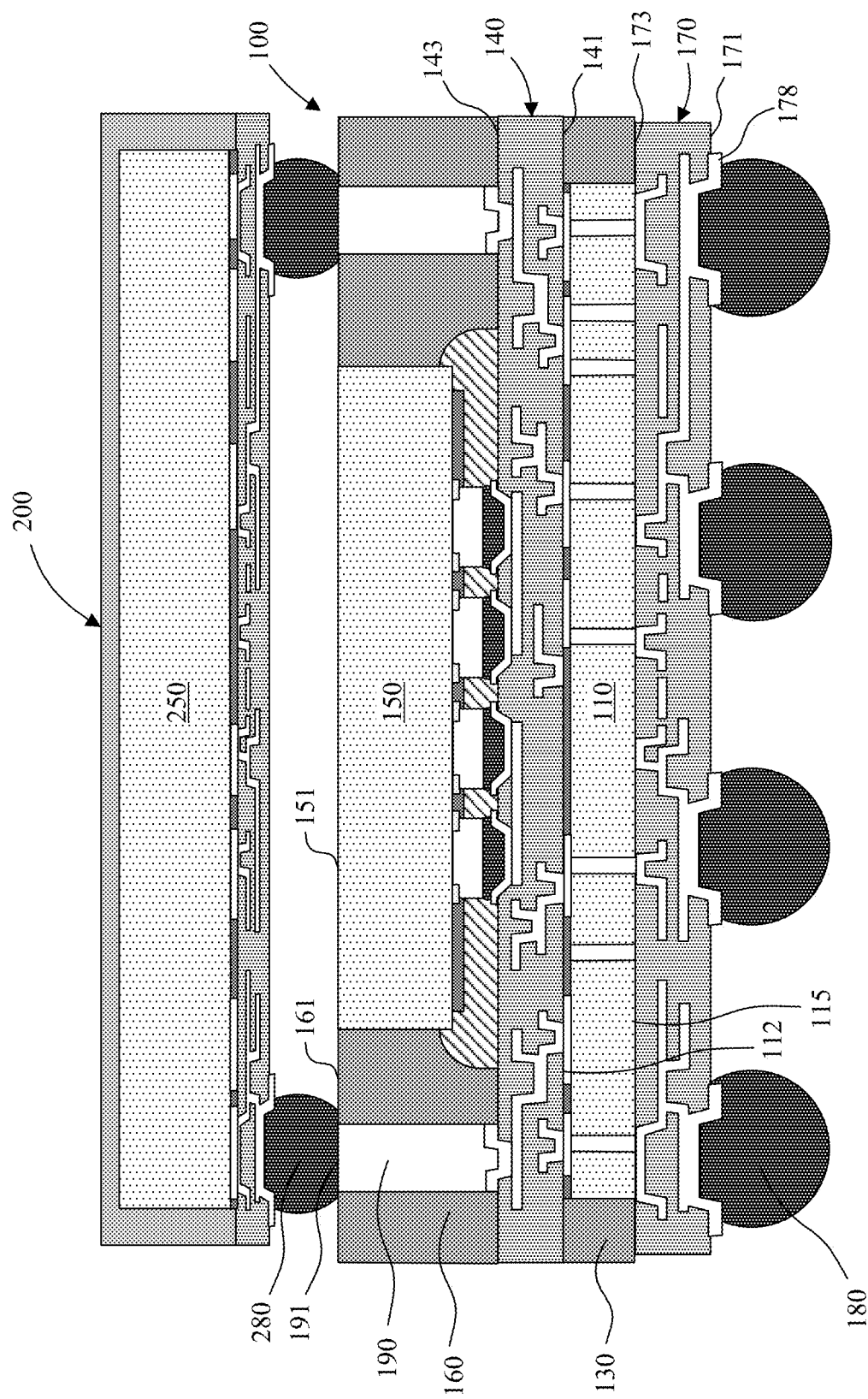
FIG. 11 is a cross-sectional side view illustration of a package on package with conductive pillars in accordance with an embodiment.

FIG. 11 is a cross-sectional side view illustration of a package on package (PoP) variation with conductive pillars 190 in accordance with an embodiment. The lower package 100 illustrated in FIG. 11 is similar to that illustrated in FIG. 10, with the addition of the optional conductive pillars 190 extending through the second level molding compound 160. The conductive pillars 190 may be formed as described with regard to FIG. 7. As shown, a top package 200 is bonded to the lower package 100 to form a PoP structure. For example, a top package 200 including a die 250 is bonded to the exposed surfaces 191 of conductive pillars 190 with conductive bumps 280 (e.g. solder bumps, or stud bumps).

Figure 12:
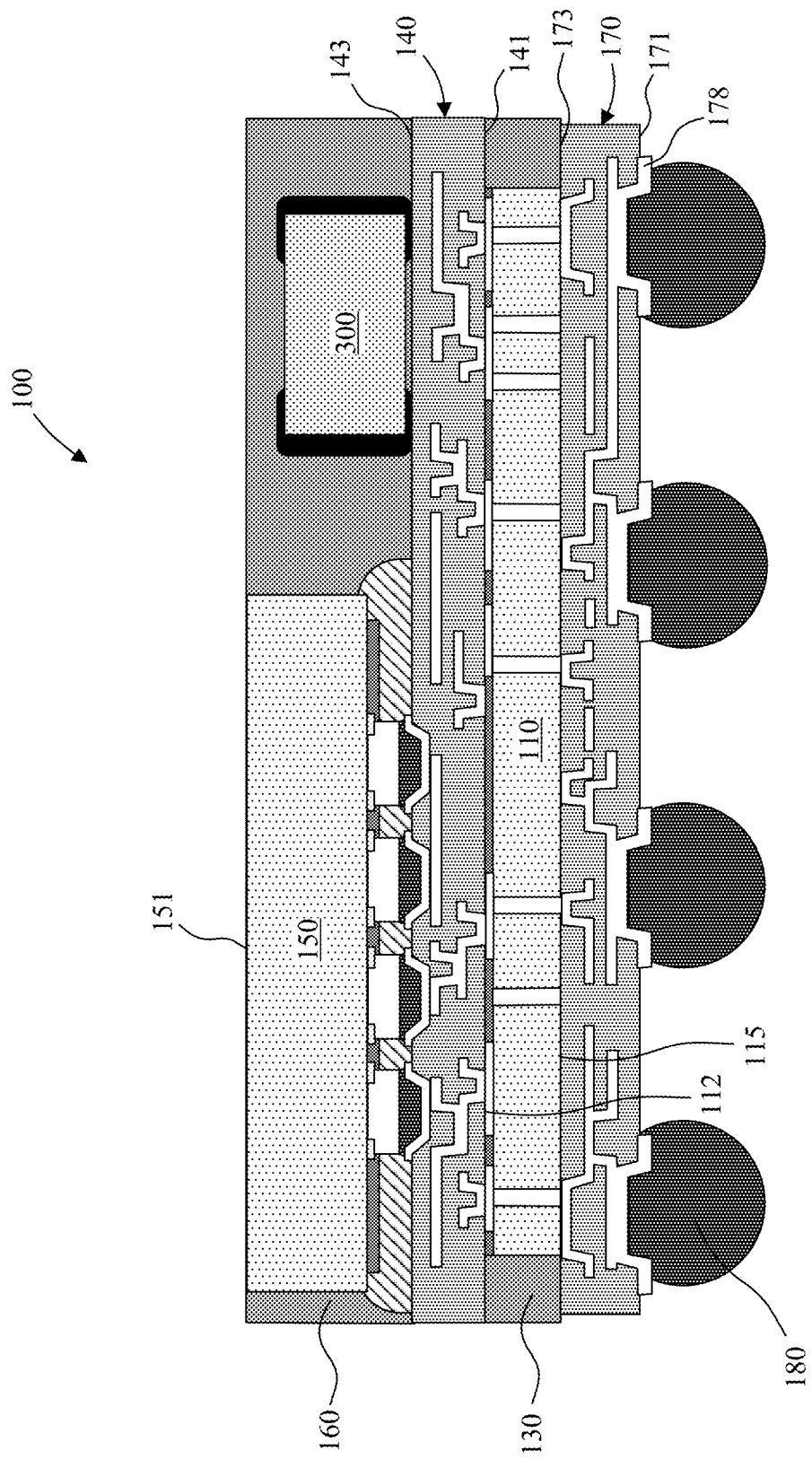
FIG. 12 is a cross-sectional side view illustration of a package with a non-silicon component in accordance with an embodiment.

FIG. 12 is a cross-sectional side view illustration of a package 100 variation with heterogeneous integration of a die 150 and non-silicon component 300 within the second level molding compound 160 in accordance with an embodiment. The package 100 illustrated in FIG. 12 is similar to package 100 illustrated in FIG. 10 with the addition of the non-silicon component 300 mounted on the first RDL 140 and encapsulated within the second level molding compound 160 similarly as described with regard to FIG. 7.

Figure 13:
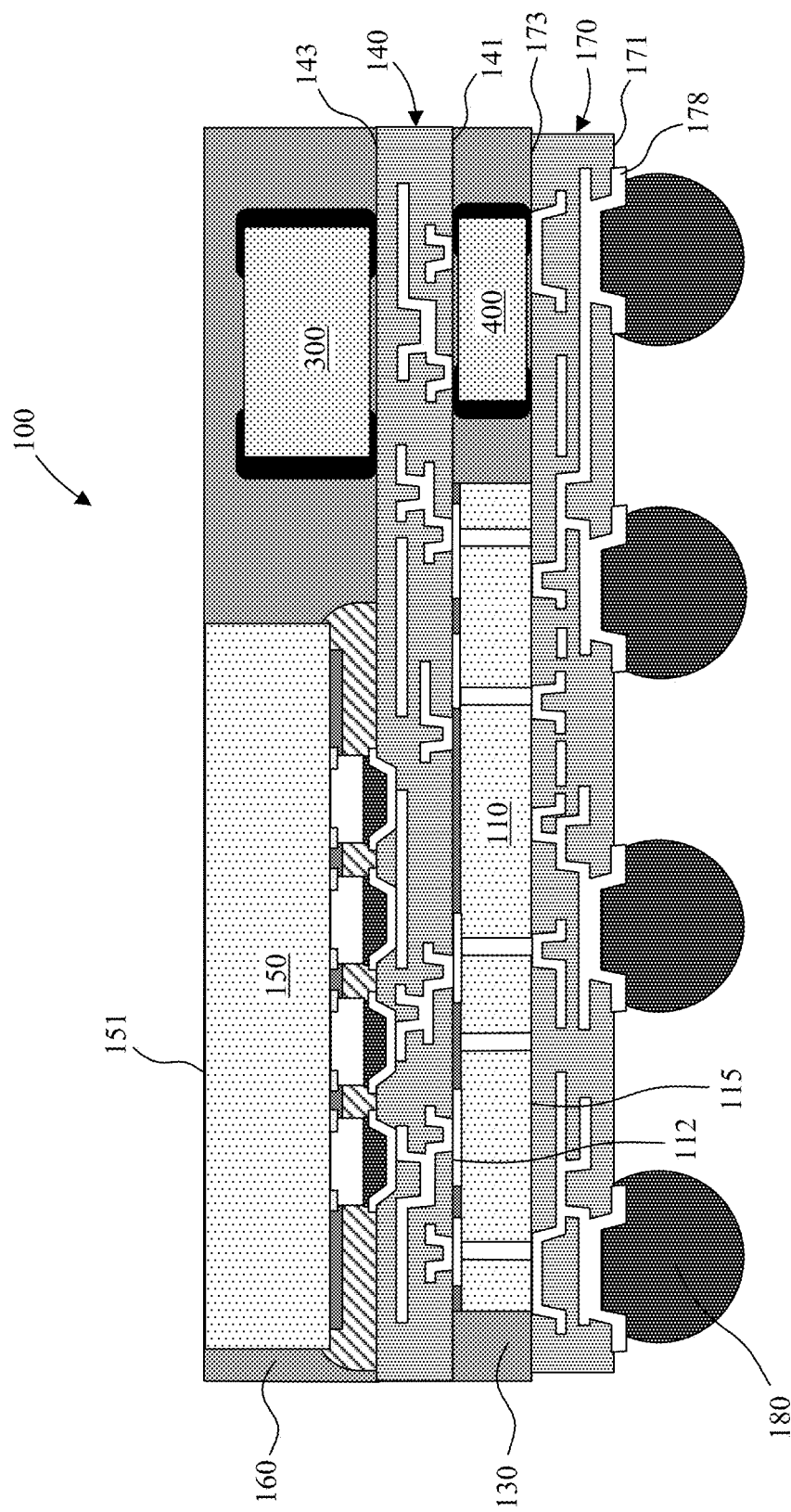
FIG. 13 is a cross-sectional side view illustration of a package with multiple tier non-silicon components in accordance with an embodiment.

FIG. 13 is a cross-sectional side view illustration of a package 100 variation with heterogeneous integration of die 110, 150 and non-silicon components 400, 300 within the first and second level molding compounds 130, 160 in accordance with an embodiment. Package 100 illustrated in FIG. 13 is similar to package 100 illustrated in FIG. 12 with the addition of a non-silicon component 400 (e.g. transducer, passive device such as inductor, capacitor, filter) embedded in the first level molding compound 130 between the first RDL 140 and second RDL 170. For example, non-silicon component 400 may have been mounted on the carrier substrate 102 similarly as the first level die 110 illustrated in FIG. 5, followed by encapsulation within the first level molding compound 130, and formation of the first RDL 140 as illustrated in FIG. 6. Additionally, the second RDL 170 may be formed on the non-silicon component 400 similarly as described with regard to FIG. 9 after the thinning operation described with regard to FIGS. 8A-8B.

While the package 100 variations described and illustrated in FIGS. 9-13 have been described and illustrated separately, many of the structural features and processing sequences may be combined in a single embodiment. In utilizing the various aspects of the embodiments, it would become apparent to one skilled in the art that combinations or variations of the above embodiments are possible for forming package including a thinned first level die with TSVs. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A package comprising:
   a first redistribution layer (RDL) including a top side and a back side;
   a second level die mounted on the top side of the first RDL;
   wherein the back side of the first RDL is on a front surface of a first level die, and the front surface of the first level die includes a first plurality of first landing pads electrically connected to active devices in the first level die and a second plurality of second landing pads electrically connected a plurality of TSVs in the first level die; and
   a second RDL including a top side and a back side, wherein the top side of the second RDL is on a back surface of the first level die.

2. The package of claim 1, wherein the first level die comprises active devices, and the first level die is less than 50 µm thick.

3. The package of claim 2, wherein the first level die comprises one or more interconnect layers between the active devices and the front surface of the first level die.

4. The package of claim 2, further comprising a first level molding compound that encapsulates the first level die between the first RDL and the second RDL.

5. The package of claim 4, further comprising a second level molding compound that encapsulates the second level die on the first RDL.

6. The package of claim 5, further comprising a plurality of conductive pillars on the first RDL and extending through the second level molding compound.

7. The package of claim 6, further comprising a second package bonded to the plurality of conductive pillars.

8. The package of claim 5, further comprising a non-silicon component mounted on the first RDL, and the second level molding compound encapsulates the non-silicon component on the first RDL.

9. The package of claim 2, further comprising a plurality of conductive bumps on the back side of the second RDL.

10. The package of claim 2, wherein each TSV has a maximum width of 10 μm or less.

11. The package of claim 10, wherein the first RDL is directly on the front surface of the first level die, the second RDL is directly on the back surface of the first level die, and the first RDL and the second RDL each have a maximum thickness of less than 30 μm.

12. A package comprising:
a first redistribution layer (RDL) including a top side and a back side;
a second level die mounted on the top side of the first (RDL);
wherein the back side of the first RDL is directly on a front surface of a first level die, the first level die comprises active devices and a plurality of through silicon vias (TSVs), and the first level die is less than 50 μm thick; and
a second RDL including a top side and a back side, wherein the top side of the second RDL is directly on a back surface of the first level die.

13. The package of claim 12, wherein each TSV has a maximum width of 10 μm or less.

14. The package of claim 13, wherein each TSV has an aspect ratio of less than 10:1 of first level die thickness: TSV maximum width.

15. The package of claim 12, wherein the first RDL and the second RDL each have a maximum thickness of less than 30 μm.

16. The package of claim 12, wherein the first level die comprises a density of at least 2,500 of the plurality of TSVs per $mm^2$.

17. The package of claim 16, wherein the first level die has a TSV keep out zone of less than 5 μm.

* * * * *